United States Patent [19]
Murugesan et al.

[11] Patent Number: 5,865,746
[45] Date of Patent: *Feb. 2, 1999

[54] IN VIVO IMAGING AND OXYMETRY BY PULSED RADIOFREQUENCY PARAMAGNETIC RESONANCE

[75] Inventors: Ramachandran Murugesan; Murali K. Cherukuri, both of Rockville; James B. Mitchell, Damascus, all of Md.; Sankaran Subramanian, Madras, India; Rolf G. Tschudin, Kensington, Md.

[73] Assignee: The United States of America as represented by the Department of Health and Human Services, Washington, D.C.

[*] Notice: This patent issued on a continued prosecution application filed under 37 CFR 1.53(d), and is subject to the twenty year patent term provisions of 35 U.S.C. 154(a)(2).

[21] Appl. No.: 902,425

[22] Filed: Jul. 29, 1997

Related U.S. Application Data

[63] Continuation of Ser. No. 504,616, Jul. 20, 1995, Pat. No. 5,678,548.

[51] Int. Cl.⁶ .................................................. A61B 5/055
[52] U.S. Cl. ........................................... 600/410; 600/413
[58] Field of Search ................................... 600/409, 410, 600/413, 420

[56] References Cited

U.S. PATENT DOCUMENTS

| | | | |
|---|---|---|---|
| 4,714,886 | 12/1987 | Halpern | 324/316 |
| 4,733,182 | 3/1988 | Clarke et al. | 324/301 |
| 4,994,746 | 2/1991 | Panosh | 324/322 |
| 5,194,825 | 3/1993 | Zametzer et al. | 330/298 |
| 5,374,895 | 12/1994 | Lee et al. | 330/51 |
| 5,387,867 | 2/1995 | Bourg et al. | 324/316 |
| 5,397,562 | 3/1995 | Mason et al. | 600/420 |
| 5,433,196 | 7/1995 | Fiat | 600/409 |
| 5,444,337 | 8/1995 | Ogawa et al. | 315/349 |
| 5,494,030 | 2/1996 | Swartz et al. | 600/410 |

FOREIGN PATENT DOCUMENTS

| | | | |
|---|---|---|---|
| 0 394 504 | 10/1990 | European Pat. Off. | G01R 33/46 |
| A3726051 | 2/1989 | Germany | G01N 24/00 |
| 2 221 040 | 1/1990 | United Kingdom | G01R 24/10 |
| 92/01235 | 1/1992 | WIPO | G01R 33/46 |

OTHER PUBLICATIONS

"Nuclear Magnetic Resonance Imaging Apparatus Using Chirp Tracking System," Yokokawa Medical System K.K. (Takeuchi), 60–444880, Mar. 11, 1985, *Patent Abstracts of Japan*.

"Atomic Memory," Brewer et al., *Scientific American*, Dec. 1984, pp. 50–57.

"Selective Compression of Frequency Modulated Pulses with the Aid of the Spin Echo Effect," Dovator et al., *Sov.Phys.Tech.Phys.*, 32(11), Nov. 1987, pp. 1308–1311.

"Imaging Radio Frequency Electron–Spin–Resonance Spectrometer with High Resolution and Sensitivity for in vivo Measurements," Halpern et al., *Review of Scientific Instruments*, 60(6), Jun. 1989, pp. 1040–1050.

"Improved Schemes for Refocusing with Frequency–Modulated Chirp Pulses," Ermakov et al., *Journal of Magnetic Resonance*, Series A 103 (1993) pp. 226–229.

(List continued on next page.)

*Primary Examiner*—William E. Kamm
*Attorney, Agent, or Firm*—Townsend and Townsend and Crew LLP

[57] ABSTRACT

A system for performing pulsed RF FT EPR spectroscopy and imaging includes an ultra-fast excitation subsystem and an ultra-fast data acquisition subsystem. Additionally, method for measuring and imaging in vivo oxygen and free radicals or for performing RF FT EPR spectroscopy utilizes short RF excitations pulses and ultra-fast sampling, digitizing, and summing steps.

9 Claims, 10 Drawing Sheets

OTHER PUBLICATIONS

"A Radiofrequency ESR Spectrometer for in vivo Imaging," Brivati et al., *Journal of Magnetic Resonance*, 92, (1991), pp. 480–489.

"Electron Paramagnetic Resonance Spectrometer for Three–Dimensional in vivo Imaging at Very Low Frequency," Alecci et al., *Review of Scientific Instruments*, 63(10), Oct. 1992, pp. 4263–4270.

"Radiofrequency FT EPR Spectroscopy and Imaging," Bourg et al., *Journal of Magnetic Resonance*, Series B., vol. 102, No. 1, Aug. 1993, pp. 112–115.

"Pulsed EPR Spectrometer," Quine et al., *Review of Scientific Instruments*, vol. 58, No. 9, Sep. 1987, pp. 1709–1723.

"A New Pulse Generator for Pulsed ESR," Lovy et al., *Measurement Science and Technology*, vol. 1, No. 8, Aug. 1990, pp. 720–724.

"Programmable Pulse Generator for EPR Imaging," Momo et al., *Measurement Science and Technology*, vol. 3, No. 3, Mar. 1992, pp. 299–301.

"Relative Benefits of Overcoupled Resonantors VS Inherently Low–Q Resonators for Pulsed Magnetic Resonance," Rinard et al., *Journal of Magnetic Resonance*, Series A, vol. 108, No. 1, May 1994, pp. 71–81.

"ESR with Stochastic Excitation," Prisner et al., *Journal of Magnetic Resonance*, vol. 84, No. 2, Sep. 1989, pp. 296–308.

"Hadamard–NRM–Spektroskopie," Ziessow et al., *Berichte der Bunsen–Gesellschaft*, vol. 78, No. 11, 1974, pp. 1168–1179.

"A Simple Pulsed Amplifier Controller," Cory et al., *Journal of Magnetic Resonance*, 72, 334–336 (1987).

"Fast 35–GHz Time–Resolved EPR Apparatus," Forbes, *Review of Scientific Instruments*, 64(2), 397–402 (1993).

"Simple Modification of Varian E–Line Microwave Bridges for Fast Time–Resolved EPR Spectroscopy," Forbes et al., *Review of Scientific Instruments*, 62(11), 2662–2665 (1991).

"Pulsed Gradient Spin–Echo ESR," Callaghan et al., *Journal of Magnetic Resonance*, Series A, 111, 127–131 (1994).

"NE/SA630 Single Pole Double Throw (SPDT) Switch," Phillips Semiconductors, product specification (1991).

FIG. 2E. Q-SWITCHING

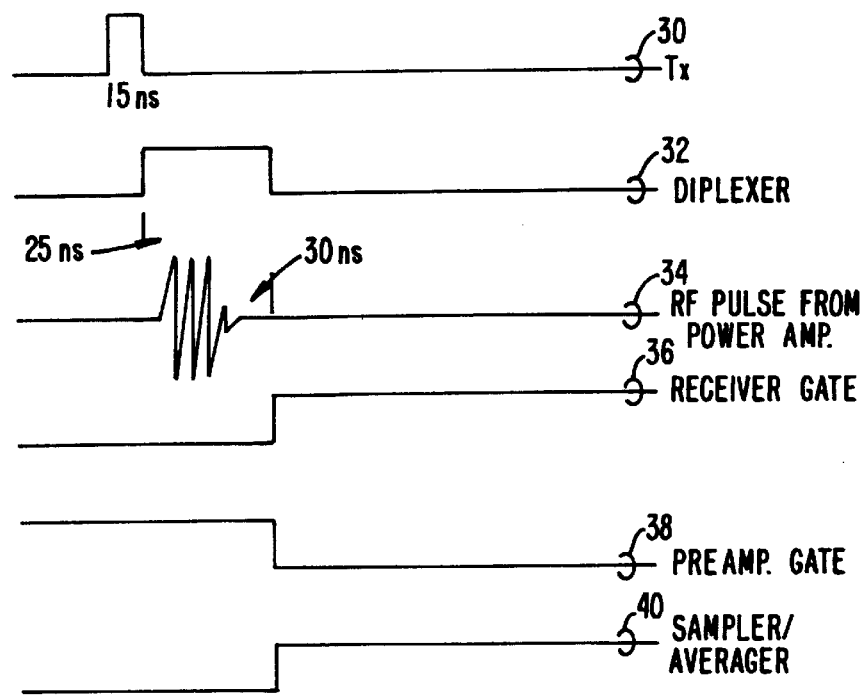
FIG. 3.
| | | | 0 | 0 | | 0 |
FIG. 4A.
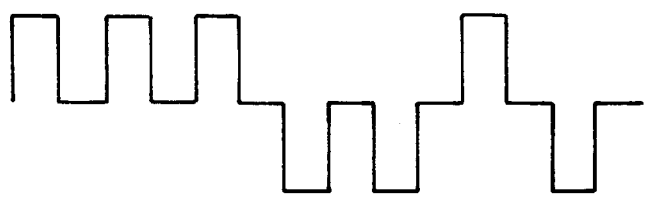
FIG. 4B.

IN VIVO IMAGING AND OXYMETRY BY PULSED RADIOFREQUENCY PARAMAGNETIC RESONANCE

This is a continuation of application Ser. No. 08/504,616 filed Jul. 20, 1995 now U.S. Pat. No. 5,678,548, the disclosure of which is incorporated by reference.

BACKGROUND OF THE INVENTION

This invention describes a fast response pulsed Radiofrequency (RF) Electron Paramagnetic Resonance (EPR) spectroscopic technique for in-vivo detection and imaging of exogenous and endogenous free radicals, oxygen measurement and imaging and other biological and biomedical applications.

The main emphasis is the use of low dead-time resonators coupled with fast recovery gated preamplifiers and ultra fast sampler/summer/summer/processor accessory. Such a spectrometer will be practical in detecting and imaging with high resolution, free radicals possessing narrow line widths. This method avoids factors compromising the imaging speed and resolution inherent in the existing Continuous Wave (CW) EPR imaging methods, where modulation and saturation broadening and artifacts of object motion are problems.

It is also possible to perform Fourier imaging and hence to produce image contrasts based on relaxation when using special narrow line free radical probes.

The response of tumors to radiation therapy and chemotherapeutic agents depends upon the oxygen tension. Hence, for an effective cancer therapy, measurement of molecular oxygen in tumors is vital1. Also in general medicine measurement of the oxygen status of ischemic tissue in circulatory insufficiency, be it acute as in stroke or myocardial infarction, or chronic as in peripheral vascular disease associated with numerous diseases such as diabetes, hyperlipedimias, etc., becomes an important tool for assessment and treatment of diseases. Although a variety of techniques are available for measuring oxygen tension in biological systems, polarographic technique is perhaps the most widely used one in clinical applications. However, this is an invasive technique. Besides patients' discomfort, the tissue damage caused by the probe electrodes leads to uncertainty in the values measured, especially so at low oxygen concentration (<10 mm Hg).

Magnetic Resonance Imaging (MRI) enjoys great success as a non invasive technique. NMR imaging, based on the perfluorinated organic compounds, has been used to study blood oxygenation of animal brains. Binding of oxygen to hemoglobin is also used in MRI of human brains to monitor oxygenation changes. However, these techniques lack sufficient sensitivity for routine applications.

Overhauser magnetic resonance imaging (OMRI), based on the enhancement of the NMR signal due to the coupling of the electron spin of an exogenously administered free radical with the water protons, is also attempted for in-vivo oxymetry. Here again the sensitivity is limited, since the organic free radicals used have low relaxivity since they don't possess the free sites for water binding as in the case of gadolinium based contrast agents. The Gd based contrast agents, however, have too short relaxation times for efficient spin polarization transfer. On the other hand, EPR oxymetry is very sensitive compared to MRI or OMRI for oxygen measurements, since it is based on the direct dipolar interaction of the paramagnetic oxygen molecule with the free radical probe.

EPR is generally performed at microwave frequencies (9 GHz). The use of microwave frequency results in substantial tissue heating, and, unfortunately, severely limits tissue penetration. Low frequency EPR has been attempted to achieve better tissue penetration. All of these studies but for the last cited one (from this lab) are done using Continuous Wave (CW) method.

Although low frequency EPR offers the potential for greater in-vivo tissue penetration, its use in continuous wave-based methods is severely limited by lack of sensitivity resulting from the physically imposed Boltzmann factor. Furthermore, sensitivity enhancement by signal averaging as done with CW methods may not be effective, since CW methods are band limited. Pulse EPR techniques, however, as presented in this application, utilize to advantage the very short electron relaxation times to enhance the signal to noise ratio in a very short time, which immediately leads to speed and sensitivity advantage in pulse EPR detection and imaging.

Further, the absence of any modulation in the FT method leads to true line widths, whereas in the CW methods finite modulation can, in the case of narrow lines, lead to artifacts and, therefore, severely limits the resolution achievable. Power saturation is another factor that extremely limits the resolution when detecting and imaging narrow line systems. Also for in vivo studies, any movement of the subject being studied poses severe problems in CW methods. Further, relaxation weighted imaging for contrast mapping is feasible mainly with the pulsed methods. Most of these advantages of pulse techniques over CW method are well established in MRI.

Application of pulse techniques to EPR has serious limitations. The very advantage of short relaxation time, which can in principle lead to virtual "real time" imaging, poses a challenge to the state of the art electronics for ultra fast excitation and data acquisition. Instrumental dead time problems become very severe, especially at low frequencies, since the ringing time constant, t=2 Q/w (where Q is the resonator quality factor and w is the carrier frequency), allows acquisition of signals only after a significant interval after excitation which can lead to loss of sensitivity.

The current invention addresses all of these problems and outlines pulsed EPR methodologies at radiofrequency region for in-vivo imaging of free radicals and oxygen measurement and imaging using suitable paramagnetic agents.

Apart from oxygen measurements, using appropriate, free radical probes, one can perform rapid imaging to map out blood vessels (for example, cardiac and cerebral angiography), study tissue characteristics and free radical metabolic intermediates in situ with or without using spin traps 21, 22 and offers also the potential to use administered paramagnetic contrast agents for imaging both normal and diseased tissues.

This invention has additional advantages as follows. Firstly, the magnetic field used is only about of 10 mT, orders of magnitude less than in MRI. Secondly, the sensitivity achievable is much higher than OMRI. Lastly, sensitivity enhancement, image resolution and imaging speed and T1 and T2 weighted imaging modalities are far superior to CW RF EPR.

SUMMARY OF THE INVENTION

According to one aspect of the invention, a pulsed EPR FT imaging and spectroscopy system includes an excitation system for forming 20 to 70 nanoseconds RF excitation pulses of about 200 to 400 MHz. A gated data acquisition system with very low dead time generates EPR response signals. A pulse sequence with a repetition rate of about 4 to 5 microseconds is sampled and summed to provide a signal having a high signal to noise ratio.

According to another aspect of the present invention is a novel RF FT EPR technique for measuring oxygen tension in-vivo in biological systems in conjunction with a suitable narrow line oxygen sensitive free radical (See Anderson, G. Ehnholm, K. Golman, M. Jurjgenson, I. Leunbach, S. Peterson, F. Rise, O. Salo and S. Vahasalo: Overhause MR imaging with agents with different line widths, Radiology 177, 246 (1990); Triarylmethyl radicals and the use of inert carbon free radicals in MRI, World Intellectual Property Organization, International Bureau, International Patent Classification A61K 49/00, C07D,519/00, C07B 61/02 //C07D 493/04, International Publication, No. WO 91/12024, (22.08.1991).) and for the detection and imaging of endogenous and exogenous free radicals. The subject of study, placed in a suitable resonator of low Q, high filling factor and coupled to a RF pulse excitation system (vide infra) is given an injection of the free radical probe and immediately thereafter it is subjected to an intense short RF pulse. The time response of the RF signal, which will be oxygen dependent and/or the signature of the free radical present, is acquired using a very fast acquisition system. The signal to noise ratio is enhanced to an extent of 60 dB in just one second by coherent averaging using an ultra fast averager (vide infra). The spatial resolution in 3-dimension is obtained by using a set of 3-axis gradient coil system.

According to another aspect of this invention, stochastic excitation or pseudo stochastic excitation with subsequent Hadamard transformation will be used where a large bandwidth is to be excited, instead of a compressed high power pulse. This will avoid sample heating considerably, because the power required for stochastic excitation is at least an order of magnitude less than in the conventional pulsed techniques. The principle and application of Hadamard transformation is well documented and illustrated in NMR spectroscopy and imaging literature. The rf carrier is modulated by a pseudo random binary sequence which is generated in a shift register and the values of the sequence are used to modulate the rf phase for each sampling interval t by +90° or −90°. The pseudo-noise sequence thus generated will be repeated in a cyclic fashion after a given number of values. The acquisition of the response and phase cycling follow standard procedures. A Hadamard transform of the response produces the FID which, upon complex Fourier transform, yields a spectrum or a single projection when gradients are present.

According to another aspect of the invention, by using free radical probes of long relaxation time gradient switching29 can be used to perform slice selective EPR tomography as in MRI, as well as all other imaging modalities used in MRI. Additionally, high gradients can be used to perform EPR microscopy.

Other advantages and features of this invention will be made apparent from the following drawings and descriptions.

BRIEF DESCRIPTION OF THE DRAWINGS

FIGS. 2E–F are schematic diagrams of a Q-circuit and an equivalent Q-circuit, respectively, utilized in the resonator of the preferred embodiment;

FIG. 3 is a timing diagram relating to the operation of the preferred embodiment;

FIGS. 4A–D are timing diagrams for using the system to implement a Hadamard excitation scheme;

DESCRIPTION OF THE PREFERRED EMBODIMENT

Figure 1:
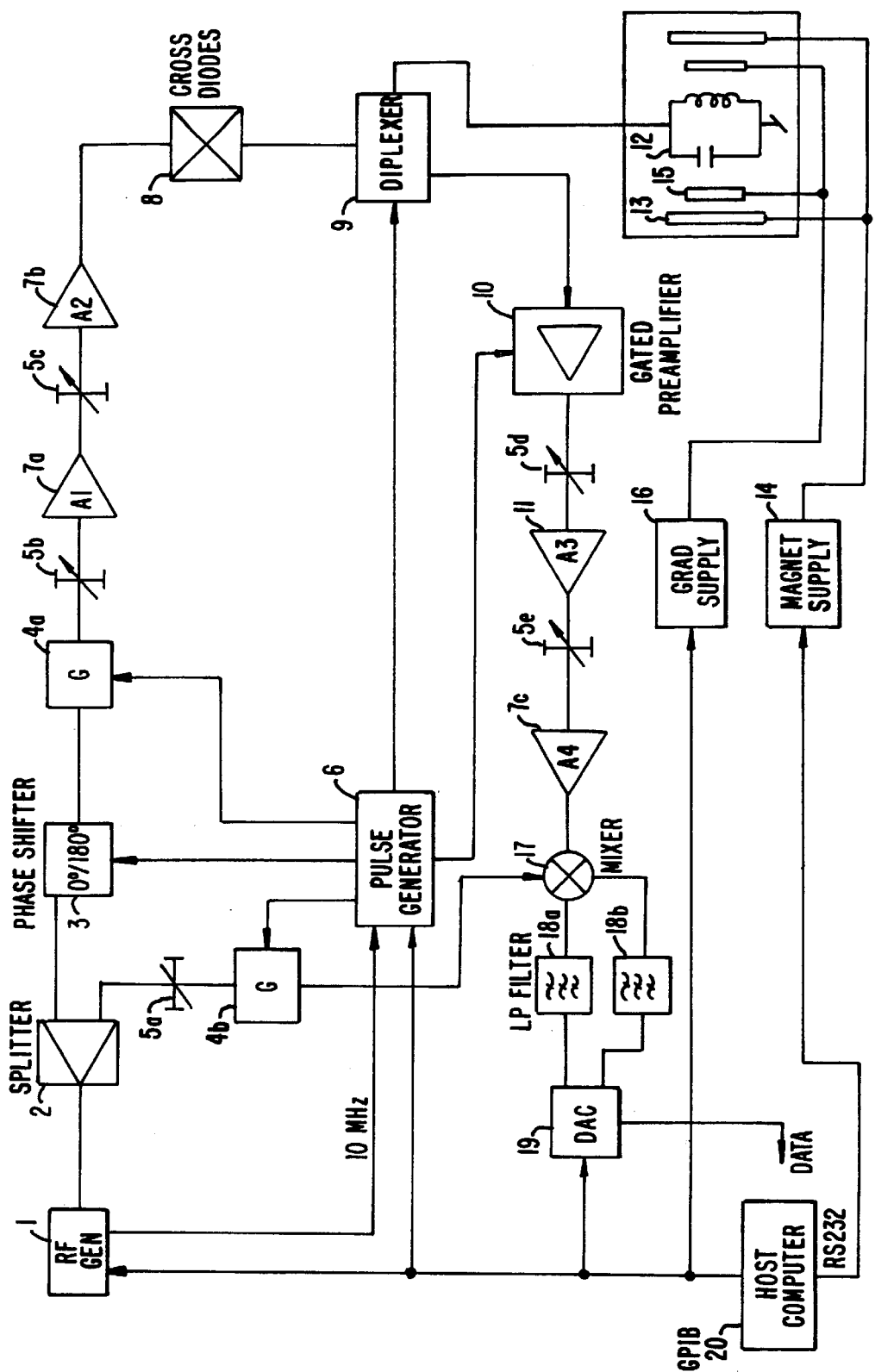
FIG. 1 is an overall block diagram of the spectrometer and imager.

FIG. 1 is a block diagram of the spectrometer/imager. RF power from a Hewlett-Packard (Palo Alto, Calif.) signal generator model HP8644A, 1 is split by a two way-zero degree power splitter (model ZSC-2-1W, Minicircuits, Brooklyn, N.Y.) 2 into two ports, one serving the reference arm and the other the transmitter side. The reference side is gated using RF gate 4b. The required gate timing is provided by a cluster of four Digital Delay Generators (model 535, Stanford Research Systems, Sunnyvale, Calif.) 6. For synchronization, the first of the delay generators utilizes the system clock generated by the RF signal generator 1 a trigger input (10 MHz). Thereby the jitter of the delay outputs is made less than 25 ps rms. The time base drift between the various delay generators is eliminated by daisy chaining the reference output of the first DG535 with the reference input on the other DG535's. Appropriate level of reference signal for mixing is selected using the variable attenuator 5a.

The other arm of the splitter is directed through a 0/180o phase shifter 3 which can be software controlled using timing pulses from 6. The transmitter pulse is gated through 4a and further amplified by a home made RF amplifier 7a (25 db) and further amplified by a power amplifier (ENI 5100L, 100 W) 7b. The optimization of the RF power level is accomplished using a set of attenuators 5b and 5c. The amplified pulses are coupled with the diplexer T/R switch 9 through a pair of crossed diodes 8 for protection from the reflected power. The diplexer switch 9 receives the timing signal from 6 and the RF pulse is delivered to the resonator 12 (vide infra).

The magnetic induction response from the object in the resonator is first taken through a specially designed gated preamplifier 10 with a low noise high gain (45 dB) capability and a very short saturation recovery time. The preamplifier gate switching is also controlled by 6. The output of the preamplifier is further amplified using amplifiers 11 and 7c with suitable attenuation in between by attenuators 5d and 5e to avoid saturation.

The reference signal from 4b and the amplified induction signal from 7c are mixed using a double balanced quad mixer 17. The real and imaginary parts are passed through two identical low pass filters 18a and 18b before sampling using a specially designed ultra fast sampler/summer/averager 19. The averaged signal is processed in a Silicon Graphics computer 20 which also controls the overall spectrometer/imager as shown by the bus connection in FIG. 1.

The resonance condition is set by changing the current in the DC magnet 13 by the power supply 14 which is addressed by the computer.

For imaging, the spatial/spectral distribution of the spin is frequency encoded by using a set of 3 axes orthogonal field gradient coils 15. The gradient. steering is done by software control of the gradient power supply 16. The overall process of generating the image/spectrum is summarized in FIG. 6.

The various components/modules depicted in FIG. 1 will now be described. In the preferred embodiment, the RF signal generator 1 is a Hewlett Packard model 8644A -Synthesized Signal Generator and the splitter 2 is a Minicircuits ZSC-2-1W (1–650 MHz).

Figure 2A:
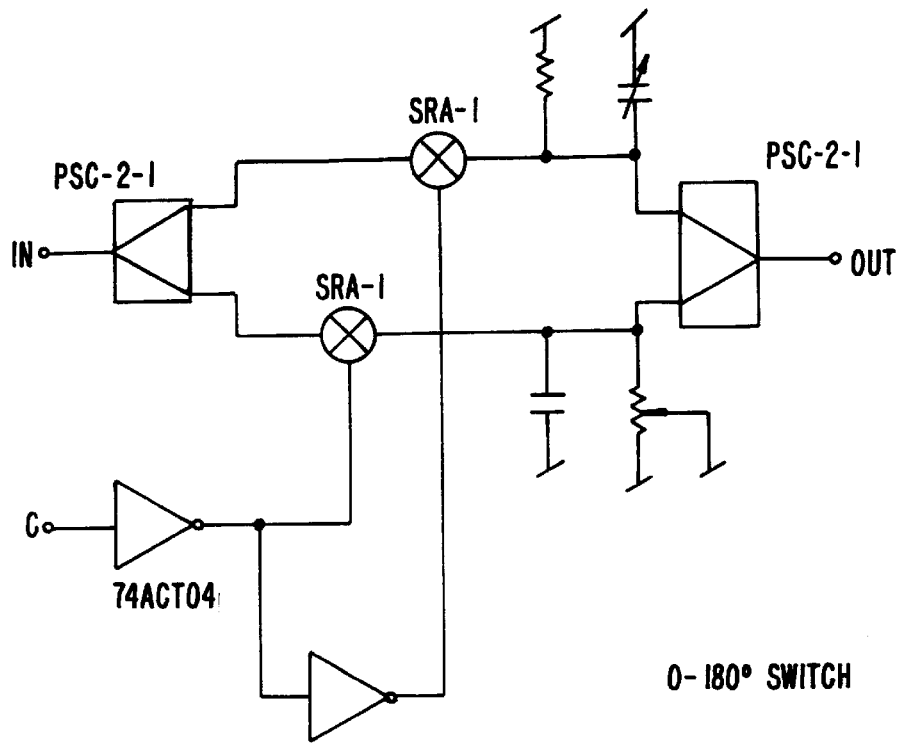
FIG. 2A is a schematic diagram of the phase-shifter used in a preferred embodiment.

The phase-shifter 3 is depicted in FIG. 2A and has been designed and built for the removal of systematic noise. A gating pulse C provided by the pulse generator may have either negative polarity (to induce a 180° phase shift) or positive polarity (to induce a 0° phase shift) where the polarity is controlled by the host computer 20.

RF from the transmitter can, despite a good isolation between the Tx and Receiver provided by the diplexer and the various gatings, leak into the receiver. This leakage can arise from pulse breakthrough while the transmitter is on and/or direct radiation into the receiver from within the spectrometer's electronics. This results in unwanted dc output from quad mixer 17. If uncorrected this can lead to large dc bias and result in spurious spike at zero frequency upon Fourier Transformation.

With the phase shifter set at 0 phase a group of FIDs, say 1000, is accumulated. Then the phase of the RF pulse is changed by 180 by a pulse given from the pulse generator 6 and another 1000 FIDs are accumulated. The resultant FID signals are unaffected, except for the change in sign and hence these are subtracted from the previous group leading to a total collection 2000 FIDs. The unwanted dc biases, from the RF leakage and the amplifiers' drift, and other systematic noises do not change in sign and hence they get subtracted. Thus, the phase shifter, besides removing the unwanted systematic noises, also helps to reduce the data collection time by half.

Figure 2C:
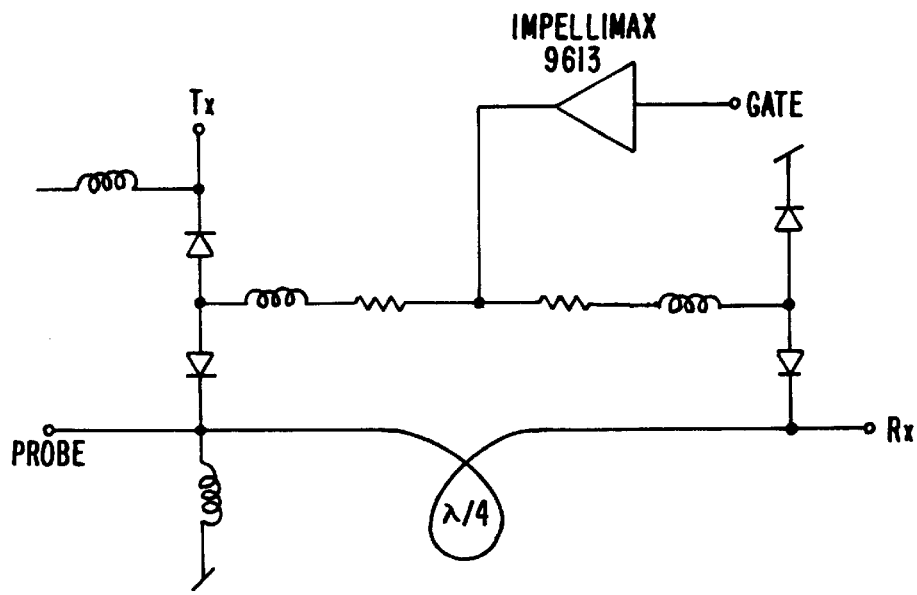
FIG. 2C is a schematic diagram of the diplexer used in a preferred embodiment.
Figure 2B:
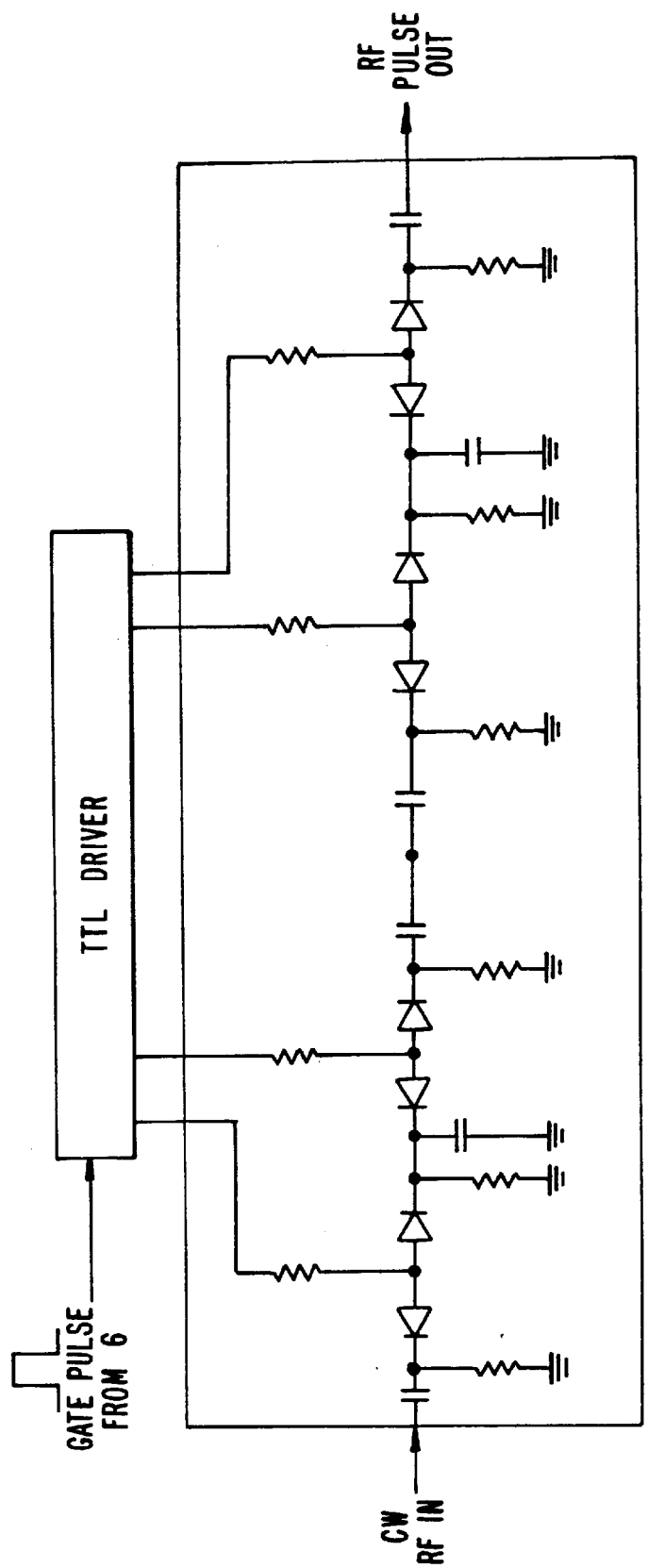
FIG. 2B is a schematic diagram of the high-speed gates used in a preferred embodiment.

The gates 4a are depicted in FIG. 2B and should possess very high on-off ratio (typically 100–120 dB) to avoid any RF leakage through the gate to the sample. Further, the rise time of the gate should be very short, since pulses of the order of 10 to 20 nano sec are used in RF FT-EPR in contrast to pulses of tens of micro second or milli second in NMR. Even a two nano sec rise time will make a 10 nano sec pulse and can distort the desired square wave pulse. Also, the gate opening and closing glitches should be minimal to avoid any amplification by the power amp 7b. To meet these demands of ultra fast excitation needed for the RF FT-EPR, the special gates depicted in FIG. 2B have been designed and built.

The attenuators 5 are Kay Electronics model 839 and the pulse generator 6 is a cluster of Stanford Research Systems DG535 four channel digital delay/pulse generators; the RF Amplifier 7a is a 10–400 MHz, 5 dBm in OP-AMP+25 dBm out.—Motorola MHW 590; the RF Power Amplifier 7b is an ENI Model 5100L Watt, 50 dB.; and the cross-diodes 8 are IN 9153 diodes. These cross diodes 8 disconnect the transmitter from the probe (tank circuit) and the preamplifier during the receiving mode to reduce the noise.

The diplexer 9 is depicted in FIG. 2C. A major requirement for a sensitive RF FT-EPR spectrometer is to design a suitable technique to couple the transmitter, probe and the receiver. During the transmit cycle high RF power of the transmitter should be delivered to the sample in the probe without damaging or overloading the sensitive receiver, and during the receiving mode any noise originating from the transmitter must be completely isolated. This is not trivial since the EPR signal of interest is in the microvolt range whereas the transmitter signal is hundreds of volt.

Further, in contrast to NMR, the very short relaxation time of EPR demands very fast closing and opening of these gates. In FIG. 2C, the diplexer gating pulse is generated by the pulse generator 6. The RF excitation pulse is received at Tx and is coupled to the probe by the diode switch when the diplexer gating pulse is asserted. Tx is isolated from the probe and Rx when the diplexer pulse is not asserted. A LAMBDA/4 cable delays the arrival of the EPR response pulse until the gate preamplifier 10 receives the gating pulse.

Within 15 nano seconds of the closing of the transmitter the transmitter signal comes down to the level of the background noise.

Figure 2D:
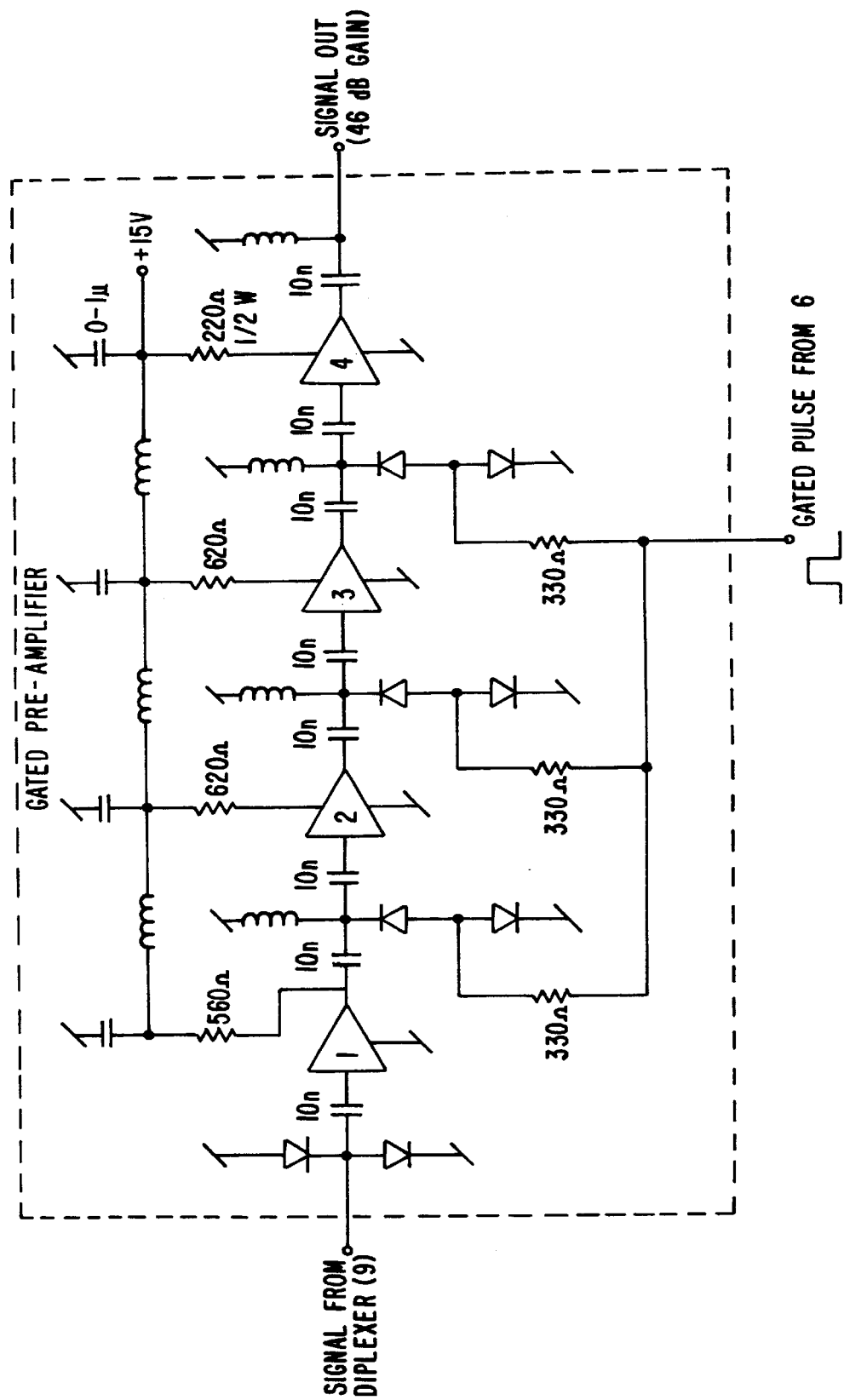
FIG. 2D is a schematic diagram of the gated preamp used in a preferred embodiment.

The gated preamplifier 10 is depicted in FIG. 2D and has a gain of 46 dB. An important problem faced in RF FT-EPR is the overload recovery of the receiver system, especially at the front end, viz, the preamplifier. Even small glitches after the close of the Tx cycle or the ring down signals can easily overload and "paralyze" the preamplifier. Hence, the preamp should have a very fast rise time and high gain. Otherwise the weak FIDs can get clobbered by the overload recovery problems. In NMR the recovery can be in micro seconds, but the short relaxation times of EPR demand nano second recovery. Otherwise it is not possible to recover the signals as soon as the subject of study is exposed to the RF pulse.

Specially designed cascaded amplifiers[30] for high gain and fast recovery are needed, especially if the preamp can be gated; then the above mentioned glitches following the Tx can be avoided. Since there are no such gated preamplifiers available, a gated preamplifier 10 has been designed and built with a fairly wide dynamic range (gain 46 dB), low noise and a very fast recovery time of 2 to 5 nano seconds. The gate of the preamp is opened 5–10 nano sec after the transmitter pulse to avoid over load saturation. The gate pulse is provided by the pulse generator.

As depicted in FIG. 2D, four monolithic amplifiers, e.g. the MAR series from Minicircuits, in Brooklyn, N.Y., are cascaded. Diode switches between the amplifiers are switched by a gating pulse generated by gating circuit 6. Other switches instead of diode switches could be used. Amplifier 11 is a MITEQ Amplifier Model 2A0150

The time constant associated with a resonant circuit is given by $$TAU = Q/PI*NU$$

Where NU is the resonance frequency following a Tx pulse of about 100 V into the resonant circuit, at least about 20 time constants are required for ringing down the decay to the level of small but measurable FID signal of about 2 micro volt. As seen from the above equation the ringdown time constant is inversely proportional to the frequency. In the case of EPR at conventional frequencies (9 GHz), this time constant is much lower than it is at the RF frequency.

Although TAU can be reduced by lowering the quality factor Q, the signal to noise ratio of the EPR signal is proportional to Q. Hence, Q cannot be compromised too much, especially so at low frequency where the signal to noise ratio is already limited by the Boltzmann factor. Also, this problem in RF FT-EPR is much more severe than the NMR due to the very short decay of the FID from the EPR signal. Hence, the resonator should have a short recovery time to collect the FID. Since the FID decays exponentially, even a small gain in the ringing time minimization can make large difference in acquiring the signal. We have adopted different approaches to solve this problem depending upon the sample of study.

Probes with equal subcoils in parallel

Since high Q coils cannot be used at low frequencies we adopted other strategies to improve the sensitivity. The S/N ratio depends on other factors such as the filling factor (F) and volume (V) of the coil. This dependence is given by $$S/N = \sqrt{(F/QV)}$$

The coil volume was increased by adding solenoidal coil segments and wiring them in parallel[31]. This coil with segments in parallel has less inductance than a single coil of the same size and hence it is possible to make large size coil to accommodate more sample for a particular frequency, thereby increasing the S/N ratio.

We have reduced the Q to optimum values, depending upon the relaxation times of the free radical probes used, by overcoupling method rather than Q spoiling, since the signal intensity is greater in the overcoupling method by a factor of 2 as given by $$S\ overcoupled / S\ spoiled = \sqrt{(2\ \beta/1+\beta)}$$

where $\beta$ is the coupling constant.

Figure 2F:
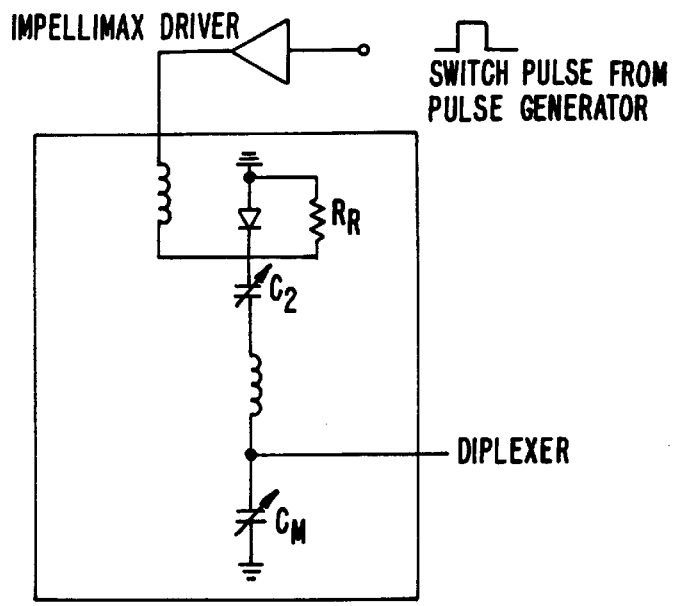
Figure 2F:
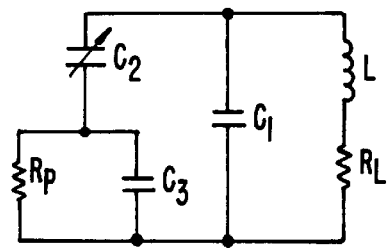

When sensitivity requirements demand high Q, dynamic Q-switching 36 can be used to cut down the resonator ringing time. Schematics of a Q-switching circuit are given in FIGS. 2E–F. The capacitor $c_2$ is used for tuning and $C_m$ for matching. A non magnetic GaAs beam lead PIN diode from M/A-COM (Burlington, Mass.) is used for Q-switching. In normal mode of operation $R_p$ is effectively the small forward bias resistance of the PIN diode. Q-switching is done by sending a short pulse (20 ns) immediately after the transmit RF pulse. During Q-switching $R_p$ is the large reverse bias resistance of the PIN diode in parallel with RR. By selecting optimum $C_1$, $C_2$, $C_3$ and Rp the total resistance of the network is maximized to minimize the ringdown time constant, $$TAUmin = 2L/(Rmax + RL)$$

where Rmax is given by $$Rmax = (\ (Rp)opt\ /\ 2(C1/C2+1)2$$

Thus, during the switching pulse, the Q of the system gets low, thereby enabling faster ring down. However, after the switch pulse the Q becomes normal in the receive cycle for greater sensitivity.

Active damping for bandwidth enlargement

To study relatively large size objects the bandwidth of excitation increases. In NMR, even a bandwidth of 70 KHz is relatively very large. However, in EPR a band width of 50–70 MHz may be needed. In principle, bandwidth enlargement can be achieved by placing a resistor in parallel with the tuned circuit. This passive damping, however, will degrade the signal. Hence, active damping 33,34 can be used to enhance the band width and to bring down the ringing time. According to this procedure, a preamp with negative feedback is employed to enhance the bandwidth without seriously degrading the signal.

Other types of resonators such as loop-gap or bird-cage types are used. These are designed to have low Q and are matched by over coupling or active damping to enhance the band width and to bring down the ringing time.

One or two turn surface coils 35 are also used for topical applications where the size of the subject is too large to be accommodated inside the resonator Another type of resonator used is of a miniature catheter type 37 for angiographic applications.

Figure 2G:
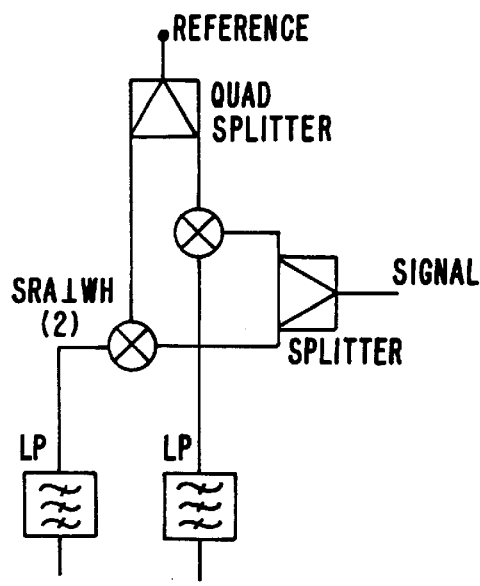
FIG. 2G is a schematic diagram of the quadrature detector used in a preferred embodiment.

The DC magnet 13 is a Magnet GMW Model 5451; the magnet power supply 14 is a Danfysik System 8000, Power Supply 858; the gradient coils 15 are (a) specially designed air cooled three axes gradient coils for 3D imaging and (b) surface gradient coils 38 for organ specific imaging. The gradient coils power supply 16 is an HP 6629A+specially designed microcomputer controlled relay system. The quad mixer 17 is depicted in FIG. 2G and the low pass filters 18a and b are specially designed.

Figure 2H:
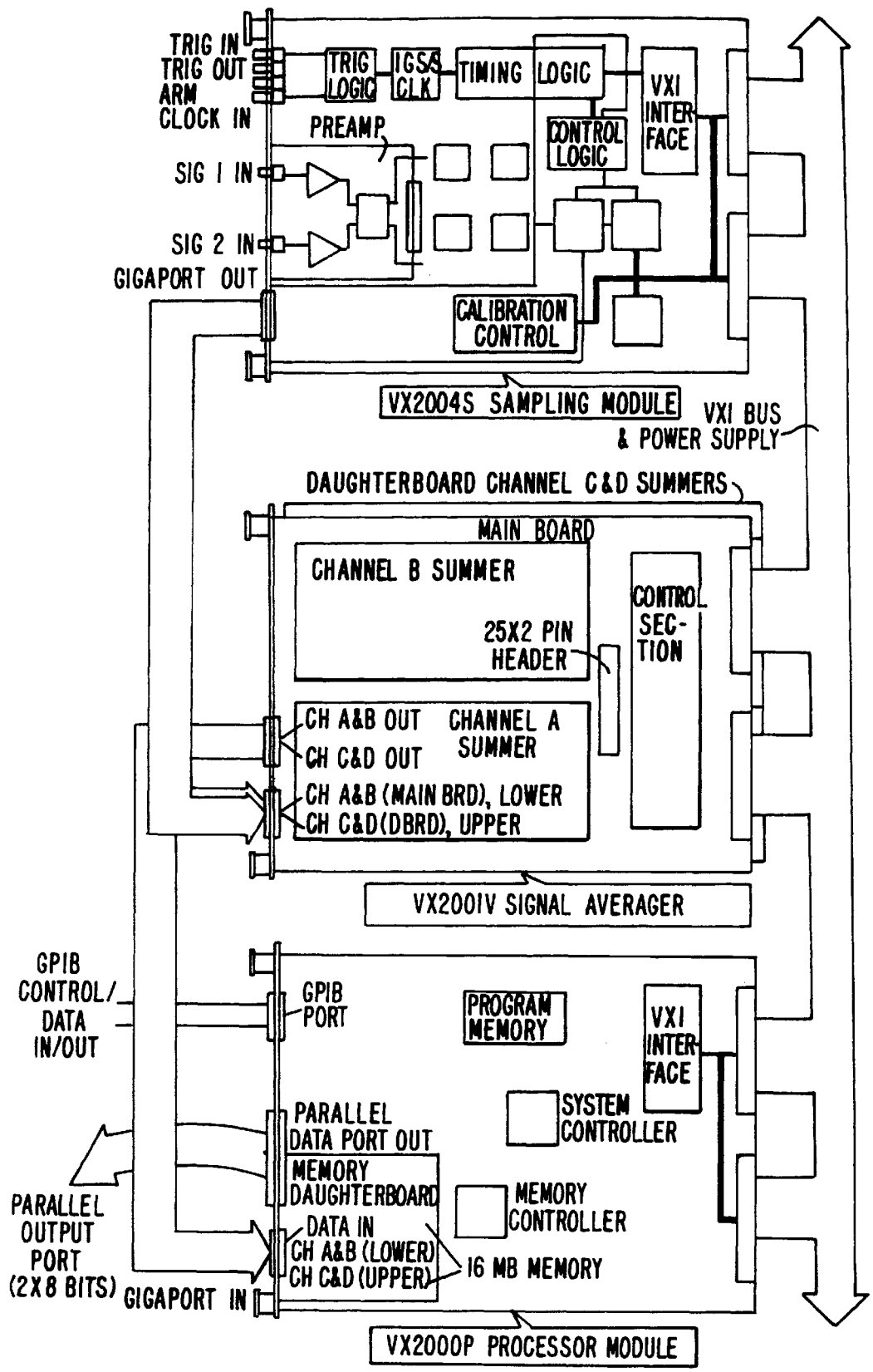
FIG. 2H is a layout diagram of the ultra-fast data acquisition subsystem used in the preferred embodiment.

The sampler/summer/averager 19 will now be described with reference to FIGS. 2H and I.

The magnetic induction response of the system of study to the exciting RF pulse is generally weak. To improve the signal to noise ratio it is necessary to carry out the signal averaging of the transient response. This is done by first digitizing and then summing the digitized data. The large line width (MHz in contrast to Hz or KHz in high resolution or solid state NMR) and the short relaxation times (nanoseconds in contrast to micro or milliseconds in NMR) encountered in EPR cause severe problems in the design and construction of suitably fast data acquisition systems for EPR imaging.

High speed digitizers with sampling frequencies up to even GHz range are now commercially available. However, these devices are generally suitable for capturing single shot events and the summing speed of the digitized data in these instruments, for data accumulations is very slow. Such slowness prohibits one from taking advantage of the very short electron spin relaxation time and thereby limits the ability to improve the S/N ratio by carrying out a large number of coherent averages in a short period of time. Hence, we have utilized an ultra fast sampler/summer/averager to enhance the speed of data collection for imaging. As shown in the block diagram of this system in FIG. 2H, it consists of three modules: a sampler, a summer and a processor.

The sampler contains four high-precision TKA10C 500-MSPS analog to digital converters. It has a vertical resolution _of_ 8 bits, with a sensitivity of +/−250 mV full scale. The sampler also has an overload protection of +/−6 volts. The sampler has two channels with a maximum interleaved sampling rate of 1 GS/s per channel or 2 GS/s if it is used in a single channel mode.

The amplifier Plug_Ins provide gain, offset and calibration signal injection for the input signal and provide sufficient drive capability for the ADCs. The signals I and Q from the quad detector are shown as SIG1 and SIG2.

Calibration and correction circuitry are provided to correct AC and DC errors to be corrected at their source. A trigger controller provides triggering capability from the external source. In the Level Triggering mode, the triggering circuitry is enabled via when the ARM input which is at a TTL high level (given by the pulse generator) and the ACQUIRE signal has been received from the processor. The sampler then digitizes the data (FID) and sends it in eight parallel data streams (each at 250 MS/s) on the gigaport.

Figure 2I:
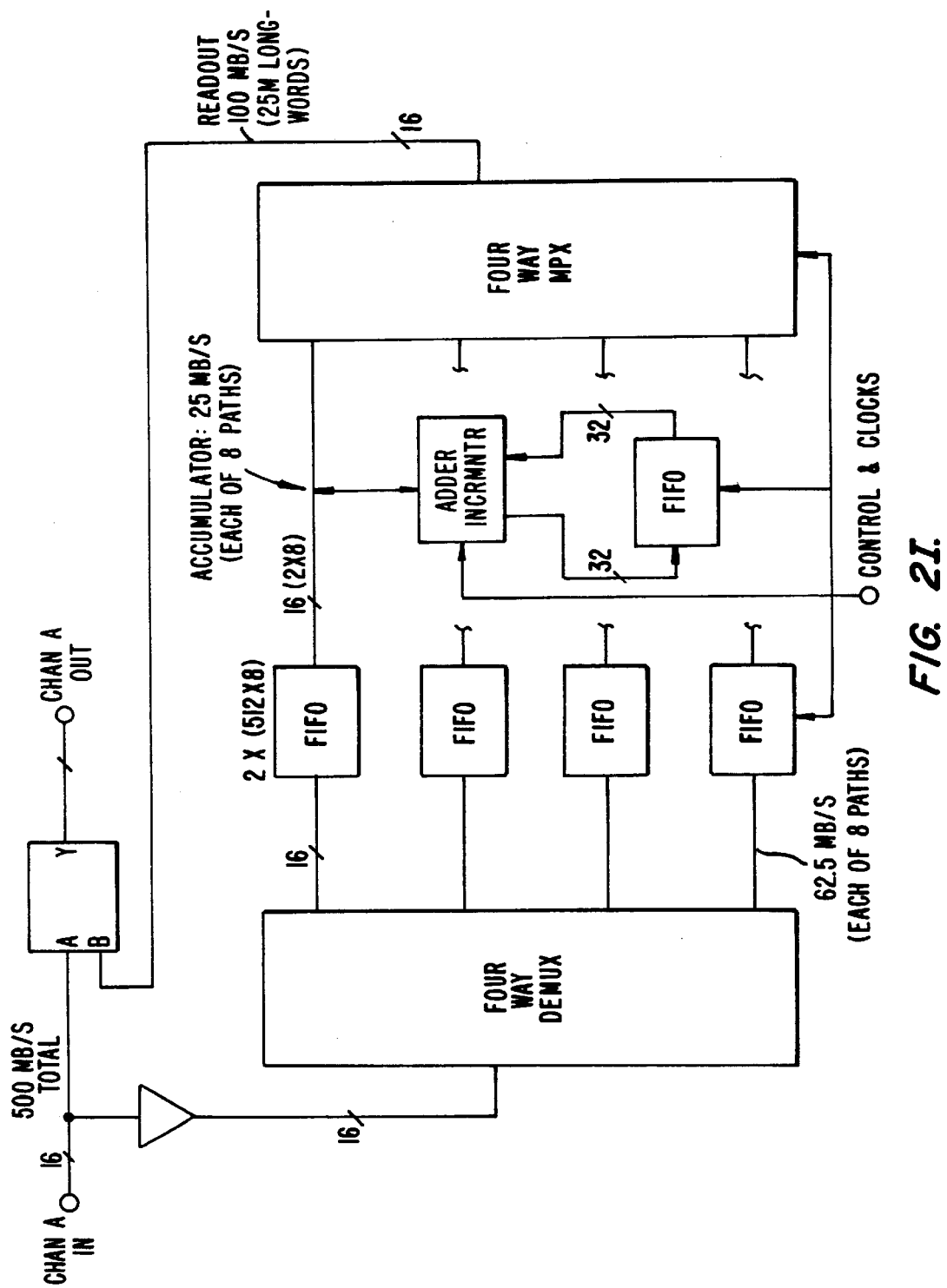
FIG. 2I is a block diagram of summing part of the ultra-fast data acquisition subsystem of FIG. 2H.

The gigaportout from the VX2004S sampling module provides data, clock and control and monitoring signals to the VX2001 signal averager. There are four channels, each providing 16 bit stream of data. Channels A and B provide the digitized data of signal 1 (Q-of the quadrature output) and C and D that of signal 2 (I of the quadrature output). The input FIFO (First-In-First-Out) memories buffer the data from the Giga-Ports. The FIFO memories can accommodate a record length of 8192 samples for each of two sampler channel pairs (A/B and C/D). A detailed block diagram for one of a channel is given in FIG. 2I.

The summing process begins when the processor activates a control signal 'P_ACCUIRE'. In response to this the summer/averager activates the sampler which in turn starts to send the digitized data over the four channels. The VX2001V sums the digitized waveform data words and then reactivates the sampler to initiate the next digitizing cycle. This process repeats until a programmed number of FIDs are summed. This programmable number is a 24 bit word and hence more than 4 million averages can be done without transferring the data to the processor.

The summation process operates in conjunction with the digitization process by the sampler when the sampler operates in Pre-Trigger mode. The summing process begins when the first words have been loaded into all of the input FIFO memories. Thus, the summing process effectively overlaps the digitization process since it does not have to wait until the input FIFO's loading process has been completed. FIDs with a record length of 1024 for both the signals at IGSPS can be summed at a rate of 230 KHz. (retrigger period of approximately 4.3 ms.) The data output from the summer is 32 bits wide and passed in sequence to the VX2000P processor as two 16-bit words.

The VX2000P processor module contains:

A Motorola 68340 micro-processor with the support of an integral 2-channel DMA controller,4 MB DRAM, 128 KB EPROM, 2 MB Flash EEPROM, 2 integral timers and 2 serial I/O channels;

an IEEE488.2 GPIB port for interface with host computer;

a graphic processor with 2 MB of DRAM, 512 KB Of VRAM, a VGA compatible videoport providing 1024*768*4 graphics;

two channels of data acquisition memory capable of acquiring data from the summer at a rate of 500 MB per second via the front panel Giga_Port connector; and a Giga-Port connector that supplies interfaces between the processor and the other modules;

A high speed Parallel Output Port for the delivery of data to the external device (Host Computer/Image processor).

The large on board memory and the video graphics allow to collect an process more than 40 projections of data before down loading the data to the host computer.

Thus, the large band width of the sampler, the summing speed, the large dynamic range of the summer/averager, on-board data memory of 16 MB RAM and fast data transfer of the processor module provide an ultra fast DAS, enabling increased sensitivity and imaging in a short time.

The computer 20 is a Silicon Graphics IRIS-4D.

FIG. 3 is a timing diagram depicting the pulses generated by pulse generator 6 to control the various elements in the system of FIG. 1 for a one pulse experiment. A transmit gating pulse 30 is generated to control the high-speed gate to transmit an RF pulse having duration of about 10 to 70 nanoseconds. For larger samples the length of the pulse could be extended up to 100 nanoseconds.

The timing of the diplexer gating pulse 32 is best understand by considering the shape 34 of the RF pulse generated by the power amplifier 7a. The diplexer gating pulse 32 is asserted at the trailing edge of the transmit gating pulse 30. There is about a 25 nanosecond delay caused by the power amplifier 7a before the RF pulse reaches the diplexer. The diplexer gating pulse also extends about 30 nanoseconds beyond the end of the RF pulse. The receiver, preamp, and sampler/averager gating pulses 36, 38, and 40 are all asserted at the trailing edge of the diplexer gating pulse.

As described above, this timing is critical to keep the gated preamplifier 10 from saturating. The magnitude of RF pulse is much greater than the magnitude of the EPR response signal. Thus, any transients or glitches resulting from ringdown in the resonator would overwhelm the preamp 10 and cause saturation. Recovery from saturation in a cascaded amplifier is very slow and the system would become unoperational.

Thus, the 30 nanosecond delay between the end of the RF pulse and the leading edge of the preamplifier gating signal allows for damping of transients and glitches and prevents preamplifier 10 from saturating. The preamplifier 10 generates an EPR response signal which includes the RF carrier signal and information relating to EPR parameters and resonant frequencies.

The quadrature mixer 17 processes the EPR response signal to generate an EPR parameter signal which is further processed to determine EPR parameters such as relaxation time and resonant frequencies.

As described above, in practice many transmit pulses are generated and the corresponding EPR responses summed to improve the signal to noise ratio. Typically, the transmit gating pulses 30 are generated at a repetition rate of 4 to 5 microseconds. This allows summing between pulses which takes about 4 microseconds. For large gradient fields the repetition rate could be slowed.

Figures 4C, 4D:
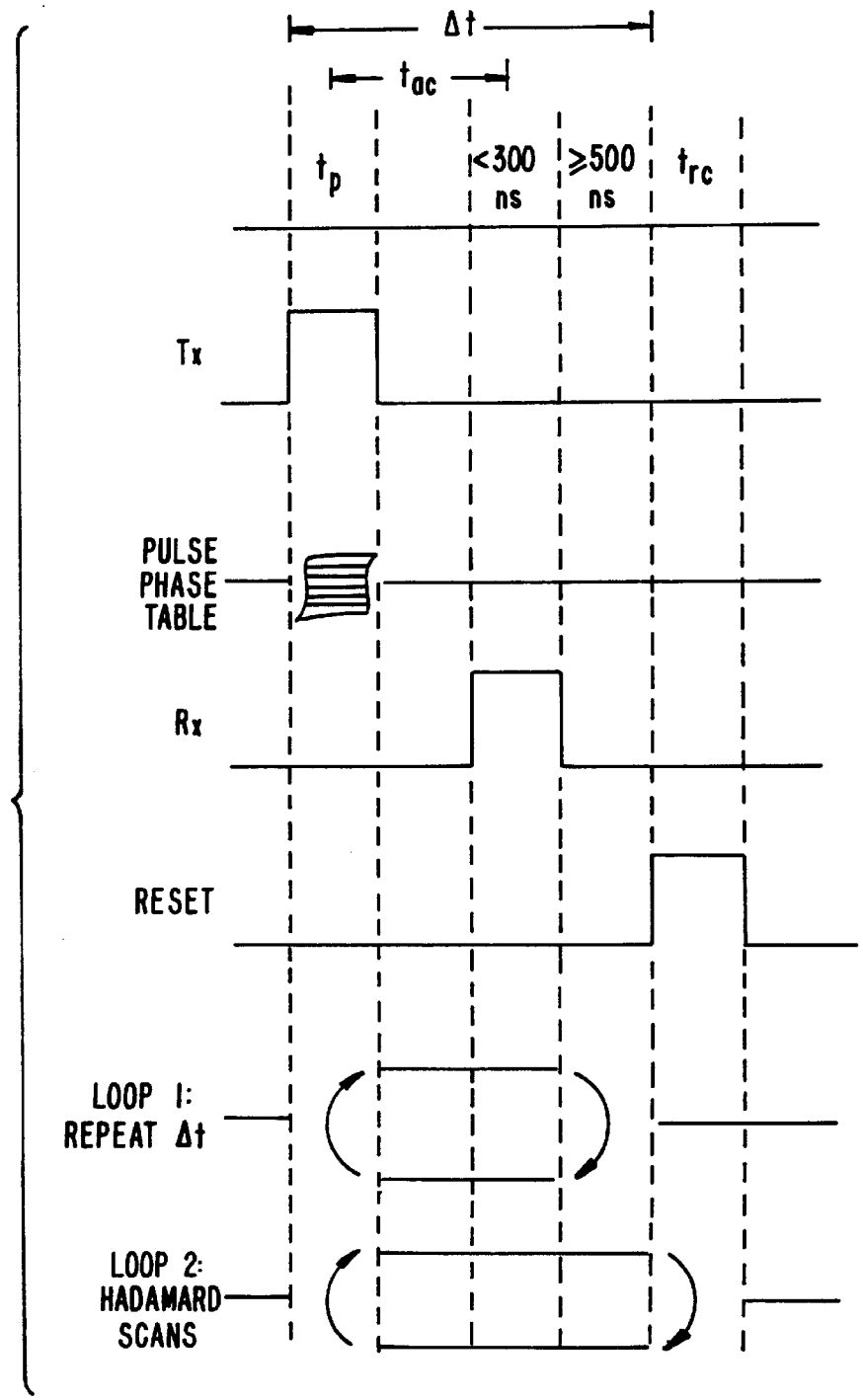

The pulse sequence for stochastic excitation or pseudo stochastic excitation is depicted in FIGS. 4C and 4B. This excitation sequence with subsequent Hadamard transformation will be used where a large bandwidth is to be excited, instead of a compressed high power pulse. This will avoid sample heating considerably, because the power required for stochastic excitation is at least an order of magnitude less than in the conventional pulsed techniques. The principle and application of Hadamard transformation is well documented and illustrated in NMR spectroscopy and imaging literature. 23–28

The rf carrier is modulated by a pseudo random binary sequence, as depicted in FIG. 4A, which is generated in a shift register or a computer program and the values of the sequence are used to modulate the rf phase for each sampling interval DELTA(T) by +90° or −90°, as depicted in FIG. 4B. The pseudo-noise sequence thus generated will be repeated in a cyclic fashion after a given number of values. Alternatively, the amplitude the RF pulses can be modulated between OFF and ON as depicted in FIG. 4C. The acquisition of the response and phase cycling follow standard procedures. A Hadamard transform of the response produces the FID which, upon complex Fourier transform, yields a spectrum or a single projection when gradients are present.

Figure 5:
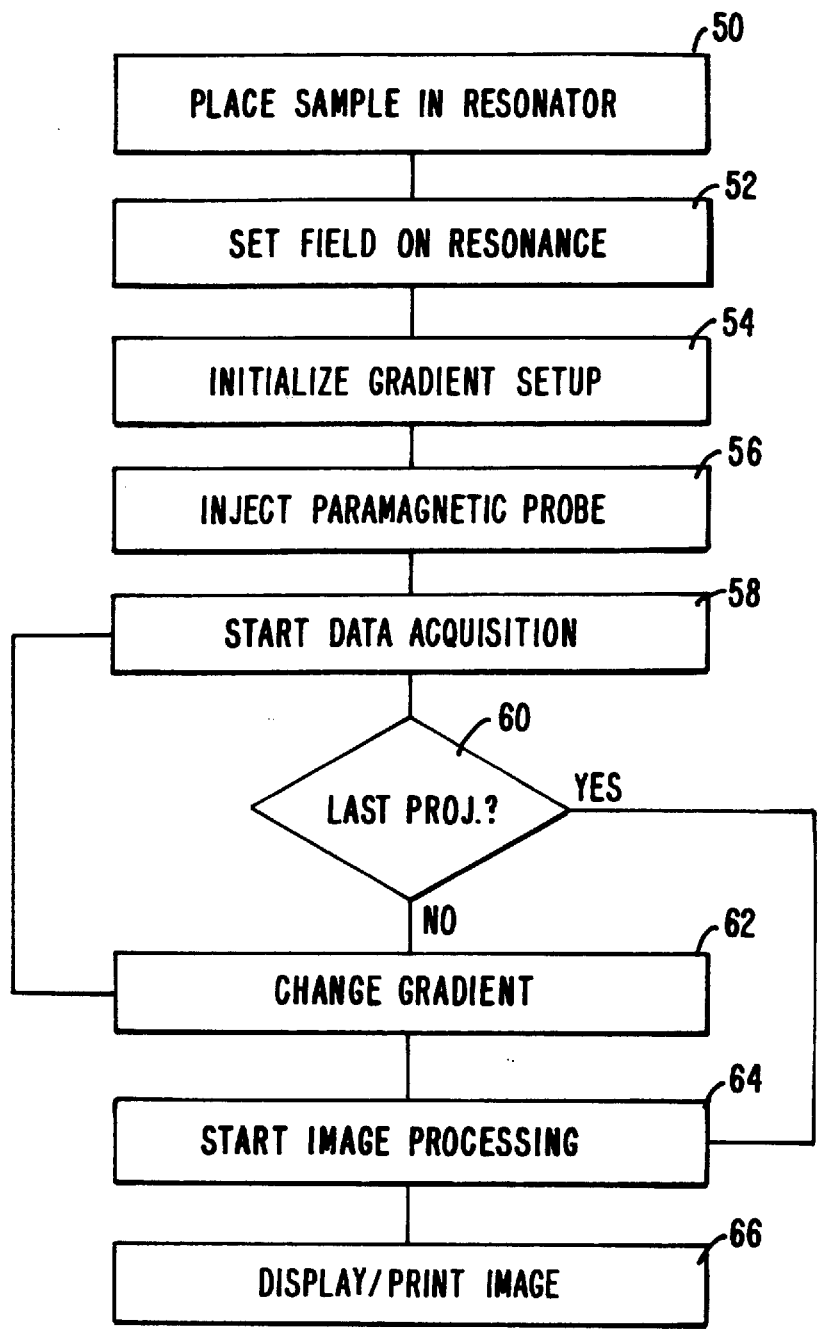
FIG. 5 is a flow chart giving the details of generating an image.

FIG. 5 is a flow chart depicting the steps required to utilize the system of FIG. 1 to perform in vivo imaging of a sample.

The sample is placed in the resonator 50 and fields are set up 52, 54 to cause the molecules to be imaged to resonate at a selected low frequency of about 300 MHz.

In many cases, a paramagnetic probe may be injected 56 into the sample to improve imaging parameters. For example, if oxygen tension of the sample is to be measured the paramagnetic probe selected will interact with oxygen to increase the relaxation rate. If short-lived free radicals are to be imaged a spin trapping agent may be injected.

Subsequently, data acquisition will be started 58. A series of 10 to 60 nanosecond RF pulses having a repetition rate of 4 to 5 microseconds will be used induce resonance in the sample. The receiver arm, gated by pulses from the pulse generator 6, will detect, amplify, demodulate, sample, digitize, and sum, EPR parameters in the time periods between RF pulses.

Various projections will be imaged by changing the gradient field 60, 62 and then image processing will be started 64 and the acquired image will displayed or printed 66.

Similar steps (excluding the injection of a probe), utilizing small resonators and large gradients, can be used to perform FT EPR microscopy, especially in devices involving distribution of paramagnetic centers, such as semiconductor wafers, Lagmuir-Blodget films, quality control of conducting polymers and non-destructive determination of stress or deterioration of polymeric substances in industry, commercial, and biomedical environment.

What is claimed is:

1. A fast response pulsed radiofrequency (RF) electron paramagnetic resonance (EPR) system, with the system utilizing a system clock signal, comprising:

a pulse generating sequential, non-overlapping transmit, diplexer, and receive gating pulses an ultra-fast excitation pulse forming subsystem including:

an RF signal generator for providing an RF signal having a frequency of between about 50 MHz and about 500 MHz;

a beam splitter, coupled to the output of the RF signal generator for splitting said RF signal into a reference RF signal and an excitation signal RF signal;

a phase shifter, coupled to said beam splitter to receive said transmitted RF signal, for controllably either passing or phase-shifting said RF excitation signal by;

a gating circuit, coupled to said phase shifter and including a gate coupled to receive a transmit gating pulse from said pulse generator having a duration of about 10 to 90 nanoseconds, for transmitting a received RF excitation signal when said transmit gating pulse is asserted, to form an excitation pulse having a duration of about 10 to about 90 nanoseconds with rise times of less than about 2 nanoseconds;

an ultra-fast data acquisition system including:

a gated preamplifier, having a signal input port and having a control input coupled to receive a receive gating pulse, said gated preamplifier for amplifying RF radiation received at said signal input port only when said receive gating pulse is received and said gated preamplifier being isolated from RF radiation received at said signal input port when said receive gating pulse is not received, with said gated preamplifier for amplifying EPR response RF radiation received at said signal input port to form an EPR response signal;

demodulating means, coupled to receive said reference RF signal and said EPR response signal, for demodulating said EPR response signal to form an EPR parameter signal;

an ultra-fast, sampling and summing unit, coupled to said demodulating means, for averaging a series of EPR parameter signals to increase signal to noise ratio, said sampling and summing unit including a high-speed sampler to digitize each received EPR parameter signal and a summing means, coupled to receive each digitized EPR parameter signal, for generating a running sum of said digitized EPR parameter signals;

a resonator for inducing paramagnetic resonance in a sample when an excitation pulse is received, for detecting EPR response RF radiation emitted from the sample due to paramagnetic resonance, and for outputting EPR response RF radiation;

a diplexer, coupled to said pulse generator to receive said excitation pulse, coupled to said resonator to receive the EPR response RF radiation, coupled to the signal input port of said gated preamplifier, and having a control input for receiving a diplexer gating pulse of a preset duration, said diplexer for coupling said ultra-fast pulse forming subsystem to said resonator when said diplexer gating pulse is received, for isolating said pulse forming system from said ultra-fast data acquisition system when said diplexer gating pulse is not received, and for providing said EPR response RF radiation from the resonator to the input signal port of said gate preamplifier subsequent to receiving said diplexer gating pulse.

2. The system of claim 1 wherein said resonator is characterized by a Q parameter, where the bandwidth of the resonator response is inversely-proportional to the magnitude of Q and the resonator ring-down time is proportional to Q, said system further comprising:

Q-switching means, coupled to said resonator and said timing controller to receive a Q-switching pulse, for increasing resonator Q and decreasing ring-down time for said resonator when a Q-switching pulse is asserted;

and wherein said pulse generator generates a Q-switching pulse of about 20 nanoseconds immediately after said transmit pulse is received at said resonator.

3. The system of claim 1 further comprising:

a DC magnet field for generating a constant magnetic field to induce magnetization in said sample;

a gradient magnet for forming a gradient in said constant magnetic field.

4. A method for measuring EPR parameters utilized to perform in vivo measurement or imaging of oxygen tension in a living sample, with a gated RF amplifier for amplifying response radiation generated by the sample, said method comprising the steps of:

providing a paramagnetic contrast agent which interacts with in vivo oxygen in the living sample to increase relaxation rate to improve imaging of oxygen;

introducing said paramagnetic contrast agent into a living sample to be imaged;

providing a magnetic resonator;

placing said living sample within the magnetic resonator;

generating a first series of RF excitation pulses, having an RF frequency between about 50 and 500 MHz separated by time intervals greater than about 4 microseconds;

coupling each RF excitation pulse in said first series to said resonator to induce EPR in said sample while isolating the gated RF amplifier from said resonator;;

coupling said gated RF amplifier to said resonator when said response radiation is generated in response to each excitation pulse in said first series to generate a first series of corresponding EPR response signals based on the interaction of in viva oxygen with said paramagnetic contrast agent in time intervals between said first series of RF excitation pulses;

digitizing and summing said first series of EPR response signals to obtain accurate values of EPR response signals; and processing said accurate value of said EPR response signals to generate a first series of EPR parameter signals.

5. The method of claim 4 further comprising the steps of:

generating a second series of RF excitation pulses separated by time intervals greater than about 4 microseconds;

phase-shifting said second series of RF excitation pulses by 180° to generate phase-shifted pulses;

coupling each-phase shifted RF excitation pulse in said second series to said resonator to induce EPR in said sample while isolating said gated RF amplifier from said resonator;

coupling said gated RF amplifier to said resonator when said response RF radiation is generated in response to each phase-shifted pulse in said second series to generate a second series of corresponding EPR response signals based on the interaction of in vivo oxygen with said paramagnetic contrast agent in time intervals between said RF excitation pulses in said second series;

digitizing and subtracting said second series of EPR response signals from said first series of EPR response signals to subtract systematic noise and DC bias to obtain accurate values of said EPR response signals; and processing said accurate values of said EPR response signals to generate a second series of EPR parameter signals.

6. A method for detecting and imaging free radicals in a sample by generating electron spin echos, with a gated RF amplifier for amplifying response radiation generated by the sample, said method comprising the steps of:

providing a magnetic resonator;

placing said sample within the magnetic resonator;

generating a first series of RF excitation pulses, having an RF frequency between about 50 and 500 MHz separated by time intervals greater than about 4 microseconds;

coupling each RF excitation pulse in said first series to said resonator to induce EPR in said sample while isolating the gated RF amplifier from said resonator;;

coupling said gated RF amplifier to said resonator when said response radiation is generated in response to each excitation pulse in said first series to generate a first series of corresponding EPR response signals in time intervals between said first series of RF excitation pulses;

digitizing and summing said first series of EPR response signals to obtain accurate values of EPR response signals;

processing said accurate value of said EPR response signals to generate a first series of EPR parameter signals;

providing gradient coil system;

utilizing said gradient coil system to generate a static gradient field along a selected axis;

generating a second series of RF excitation pulses separated by time intervals greater than about 4 microseconds;

phase-shifting said second series of RF excitation pulses by 180° to generate phase-shifted pulses;

coupling each-phase shifted RF excitation pulse in said second series to said resonator to induce EPR in said sample while isolating said gated RF amplifier from said resonator;

coupling said gated RF amplifier to said resonator when said response RF radiation is generated in response to each phase-shifted pulse in said second series to generate a second series of corresponding EPR response signals in time intervals between said RF excitation pulses in said second series;

digitizing and subtracting said second series of EPR response signals from said first series of EPR response signals to subtract systematic noise and DC bias to obtain accurate values of said EPR response signals;

processing said accurate values of said EPR response signals to generate a second series of EPR parameter signals; and repeating said steps to obtain a large number of projections to obtain the image of the free radicals by back projection.

7. A method for obtaining spectral spatial imaging of free radicals in a sample by frequency and phase encoded Fourier transform methods using pulsed magnetic field gradients, with a gated RF amplifier for amplifying response radiation generated by the sample, said method comprising the steps of:

providing a magnetic resonator;

placing said sample within the magnetic resonator;

generating a first series of RF excitation pulses, having an RF frequency between about 50 and 500 MHz separated by time intervals greater than about 4 microseconds;

coupling each RF excitation pulse in said first series to said resonator to induce EPR in said sample while isolating the gated RF amplifier from said resonator;

coupling said gated RF amplifier to said resonator when said response radiation is generated in response to each excitation pulse in said first series to generate a first series of corresponding EPR response signals in time intervals between said first series of RF excitation pulses;

digitizing and summing said first series of EPR response signals to obtain accurate values of EPR response signals;

processing said accurate value of said EPR response signals to generate a first series of EPR parameter signals;

providing gradient coil system that generates a gradient field in response to receipt of a gradient pulse;

providing a gradient pulse to said gradient coil system to generate a static gradient field along a selected axis;

generating a second series of RF excitation pulses separated by time intervals greater than about 4 microseconds;

phase-shifting said second series of RF excitation pulses by 180° to generate phase-shifted pulses;

coupling each-phase shifted RF excitation pulse in said second series to said resonator to induce EPR in said sample while isolating said gated RF amplifier from said resonator;

coupling said gated RF amplifier to said resonator when said response RF radiation is generated in response to each phase-shifted pulse in said second series to generate a second series of corresponding EPR response signals in time intervals between said RF excitation pulses in said second series;

digitizing and subtracting said second series of EPR response signals from said first series of EPR response signals to subtract systematic noise and DC bias to obtain accurate values of said EPR response signals;

processing said accurate values of said EPR response signals to generate a second series of EPR parameter signals; and stepping up the magnitude of said gradient pulse to obtain spectral-spatial image of free radicals by phase encoding; and applying stepped pulsed gradient during the collection of EPR response of the signal to obtain spatial imaging by frequency encoding.

8. A method for obtaining the T1 weighted spectral spatial imaging of free radicals in a sample by frequency and phase encoded Fourier transform methods using pulsed magnetic field gradients, with a gated RF amplifier for amplifying response radiation generated by the sample, said method comprising the steps of:

providing a magnetic resonator;

placing said sample within the magnetic resonator;

generating a first series of RF excitation pulses, having an RF frequency between about 50 and 500 MHz separated by time intervals greater than about 4 microseconds;

coupling each RF excitation pulse in said first series to said resonator to induce EPR in said sample while isolating the gated RF amplifier from said resonator;;

coupling said gated RF amplifier to said resonator when said response radiation is generated in response to each excitation pulse in said first series to generate a first series of corresponding EPR response signals in time intervals between said first series of RF excitation pulses;

digitizing and summing said first series of EPR response signals to obtain accurate values of EPR response signals;

processing said accurate value of said EPR response signals to generate a first series of EPR parameter signals;

providing gradient coil system that generates a gradient field in response to receipt of a gradient pulse;

providing a gradient pulse to said gradient coil system to generate a static gradient field along a selected axis;

generating a second series of RF excitation pulses separated by time intervals greater than about 4 microseconds;

phase-shifting said second series of RF excitation pulses by 180° to generate phase-shifted pulses;

coupling each-phase shifted RF excitation pulse in said second series to said resonator to induce EPR in said sample while isolating said gated RF amplifier from said resonator;

coupling said gated RF amplifier to said resonator when said response RF radiation is generated in response to each phase-shifted pulse in said second series to generate a second series of corresponding EPR response signals in time intervals between said RF excitation pulses in said second series;

digitizing and subtracting said second series of EPR response signals from said first series of EPR response signals to subtract systematic noise and DC bias to obtain accurate values of said EPR response signals;

processing said accurate values of said EPR response signals to generate a second series of EPR parameter signals; and combining inversion recovery and saturation recovery IRF pulse sequences;

stepping up the magnitude of said gradient pulse to obtain spectral-spatial image of free radicals by phase encoding; and applying stepped pulsed gradient during the collection of EPR response of the signal to obtain spatial imaging by frequency encoding.

9. A method for measuring EPR parameters utilized to perform in vivo measurement or imaging of free radicals in a living sample without artifact arising from respiratory motion or physiological motion such as hear beating, with an imaging gate signal generated from the respiratory or hear cycle of the living sample, with a gated RF amplifier for amplifying response radiation generated by the sample, said method comprising the steps of:

providing a magnetic resonator;

placing said living sample within the magnetic resonator;

generating, in response to said imaging gate signal, a first series of RF excitation pulses, having an RF frequency between about 50 and 500 MHz separated by time intervals greater than about 4 microseconds;

coupling each RF excitation pulse in said first series to said resonator to induce EPR in said sample while isolating the gated RF amplifier from said resonator;;

coupling said gated RF amplifier to said resonator when said response radiation is generated in response to each excitation pulse in said first series to generate a first series of corresponding EPR response signals based on the interaction of in vivo oxygen with said paramagnetic contrast agent in time intervals between said first series of RF excitation pulses;

digitizing and summing said first series of EPR response signals to obtain accurate values of EPR response signals; and processing said accurate value of said EPR response signals to generate a first series of EPR parameter signals so that generation RF pulses and digitizing and summing is carried out during the on or off cycles of the motion to obtain images reflecting the effects of motion or devoid of the effects of motion.

* * * * *